(12) United States Patent
Fu et al.

(10) Patent No.: US 6,822,483 B1
(45) Date of Patent: Nov. 23, 2004

(54) NO RESONANCE MODE BANG-BANG PHASE DETECTOR

(75) Inventors: Wei Fu, San Diego, CA (US); Joseph J. Balardeta, Del Mar, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 10/121,013

(22) Filed: Apr. 9, 2002

(51) Int. Cl.$^7$ .............................................. G01R 25/00
(52) U.S. Cl. .............................................. 327/2; 327/3
(58) Field of Search .......................... 327/2, 3, 5, 7, 327/8, 12, 149, 158, 153, 161

(56) References Cited

U.S. PATENT DOCUMENTS

| | | | |
|---|---|---|---|
| 4,291,274 A | * | 9/1981 | Suzuki et al. .................. 327/12 |
| 4,959,733 A | * | 9/1990 | Miura et al. .................. 386/87 |
| 6,538,475 B1 | * | 3/2003 | Johansen et al. ............. 327/12 |

OTHER PUBLICATIONS

Lee, Thomas H., et al., "A 2.5 V CMOS Delay–Locked Loop for an 18 Mbit, 500 Megabyte/s DRAM," IEEE J. Solid–State Circuits, vol. 29, No. 12, Dec. 1994, pp. 1491–1496.

Alexander, J.D.H., "Clock Recovery From Random Binary Signals," Electronic Letters, vol. 11, No. 22, Oct. 30, 1975, pp. 541–542.

Hogge, Charles R., "A Self Correcting Clock Recovery Circuit," IEEE Journal of Lightwave Technology, vol. LT–3, No. 6, Dec. 1985, pp. 1312–1314.

\* cited by examiner

*Primary Examiner*—Linh M. Nguyen
(74) *Attorney, Agent, or Firm*—Incaplaw; Terrance A. Meador

(57) ABSTRACT

A bang-bang phase detector circuit for use in a delay lock loop is disclosed. The phase detector includes a data signal line, a clock signal line, and a delay cell having an input coupled to the data signal line. The phase detector further includes a first double flip-flop having a data input coupled to the data signal line and a clock input coupled to the clock signal line, and a second double flip-flop having a data input coupled to an output of the delay cell and a clock input coupled to the clock signal line. A NOR circuit has a first input coupled to an output of the first double flip-flop and a second input coupled to an output of the second double flip-flop. The phase detector provides a lag output signal line coupled to an output of the NOR circuit, and a lead output signal line coupled to the output of the second double flip-flop.

6 Claims, 2 Drawing Sheets

NO RESONANCE MODE BANG-BANG PHASE DETECTOR

BACKGROUND OF THE INVENTION

This invention relates generally to delay lock loop (DLL) circuits, and more particularly to a no-resonance bang-bang phase detector in a DLL for low jitter applications.

DLLs have been widely used for reducing clock skew. FIG. 1 is a simplified block diagram of a conventional DLL circuit 100. The circuit 100 includes a reference clock signal line 101, a clock variable delay unit 102, a clock feedback signal line 103, and a phase detector 106 having a lead output and a lag output. Most conventional DLL circuits use either a bang-bang phase detector (BBPD) or a linear phase detector (LPD) as the phase detector 106. The circuit 100 further includes a filter 108, a lock circuit 110, and reference clock output 109.

When the DLL circuit 100 is in lock mode, oscillation will occur at the output of the phase detector 106. In the case where a BBPD is used, resonance will develop which results in a nonlinear behavior for the DLL circuit 100. Unfortunately, the jitter performance of most DLLs is limited by the nonlinear behavior BBPDs because there is oscillation at lock mode. Alternatively, the LPD is very difficult to implement digitally.

What is needed is a BBPD without a resonance mode, having an operation more like a LPD. Further, what is needed is a phase detector circuit having low jitter.

SUMMARY OF THE INVENTION

This invention provides a phase detector circuit that eliminates oscillation in order to achieve low jitter performance. Embodied as a bang-bang phase detector (BBPD), the present invention operates much like a linear phase detector (LPD). The invention, in combination with a nonlinear digital filter, also provides a low-jitter performance for a delay lock loop (DLL) circuit.

According to one embodiment of the invention, a BBPD circuit includes a data signal line, a clock signal line, and a delay cell having an input coupled to the data input. The BBPD circuit further includes a first double flip-flop having a data input coupled to the data signal line and a clock input coupled to the clock signal line, and a second double flip-flop having a data input coupled to an output of the delay cell and a second input coupled to the clock signal line. The circuit further includes a NOR circuit having a first input coupled to an output of the first double flip-flop and a second input coupled to an output of the second double flip-flop. The circuit provides a lag output signal line coupled to an output of the NOR circuit, and a lead output signal line coupled to the output of the fourth flip-flop.

According to another embodiment of the invention, a delay lock loop (DLL) system or circuit includes a variable delay unit for receiving a reference clock signal, a clock buffer for receiving a clock feedback signal, and a phase detector. The phase detector includes a delay cell having an input for receiving an output of the variable delay unit, and a first sequential logic circuit having an input for receiving the output of the variable delay unit and a clock input for receiving the clock feedback signal. The phase detector further includes a second sequential logic circuit having an input for receiving an output of the delay cell, an input for receiving the clock feedback signal, and an output for outputting a lead signal. The phase detector further includes a NOR circuit having a first input for receiving an output of the first sequential logic circuit, a second input for receiving an output of the second sequential logic circuit, and an output for outputting a lag signal. The DLL further includes a nonlinear digital filter and control circuit for receiving the lead signal and lag signal, and for controlling the variable delay unit, and a lock circuit for receiving an output from the filter/control circuit and outputting an DLL output.

In accordance with the invention, the BBPD circuit operates much like a phase detector, and combined with a nonlinear digital filter, achieves low jitter. The BBPD operates according to a no-resonance mode to eliminate oscillation within the DLL.

DETAILED DESCRIPTION OF THE PREFERRED EMBODIMENTS

This invention provides a no-resonance mode bang bang (i.e. binary) phase detector for low jitter applications. In accordance with a preferred embodiment of the invention, a bang-bang phase detector circuit includes a clock signal line and a data signal line. A delay cell has an input coupled to the data signal line. The circuit also includes a first sequential logic circuit having a data input coupled to the data signal line and a clock input coupled to the clock signal line, and a second sequential logic circuit having a data input coupled to an output of the delay cell and a clock input coupled to the clock signal line. The circuit further includes a NOR circuit, or equivalent logic, having a first input coupled to an output of the first sequential logic circuit and a second input coupled to an output of the second sequential logic circuit. A lag signal output is coupled to an output of the NOR circuit, and a lead signal output is coupled to the output of the second sequential logic circuit.

According to one embodiment of the invention, the first sequential logic circuit includes a first sequential logic element having a data input coupled to the data signal line and a clock input coupled to the clock signal line, and a second sequential logic element having a data input coupled to an output of the first sequential logic element and a clock input coupled to the clock signal line.

According to the embodiment, the second sequential logic circuit includes a third sequential logic element having a data input coupled to an output of the delay cell and a second input coupled to the clock signal line, and a fourth sequential logic element having a data input coupled to an output of the third sequential logic element and a clock input coupled to the clock signal line.

In accordance with an exemplary embodiment of the invention, each of the sequential logic elements is a flip-flop, or similar two-position relay configured to lock in alternate positions upon receiving successive actuating pulses. Double flip-flops are used to minimize the metastability region of the circuit.

Figure 1:
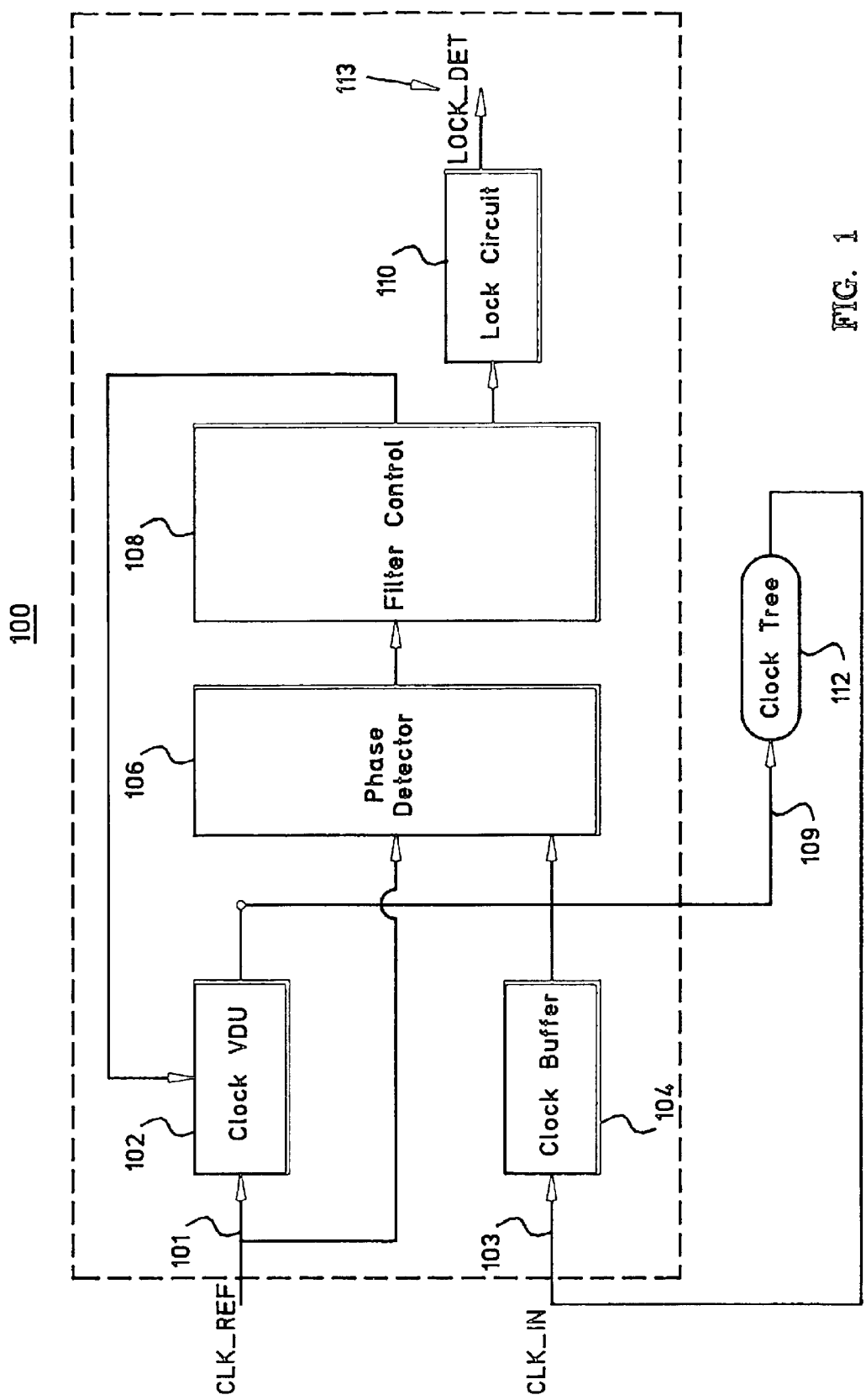
FIG. 1 is a simplified block diagram of a delay lock loop (DLL).
Figure 2:
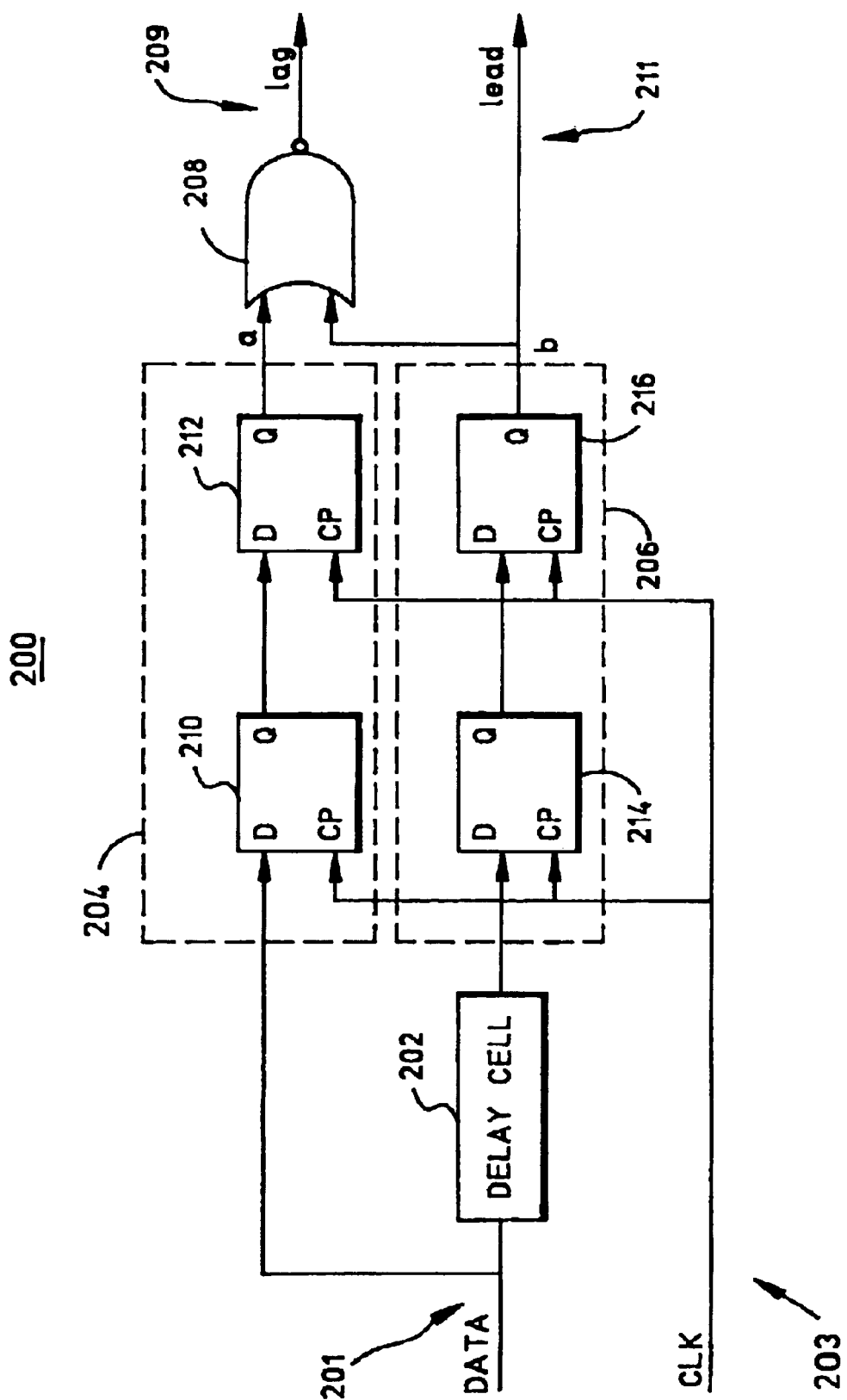
FIG. 2 is a block diagram of a phase detection circuit according to an embodiment of the invention.

FIG. 2 shows a preferred embodiment of a bang bang phase detector 200 in accordance with the invention. The phase detector 200 can be suitably used as the phase detector 106 in an otherwise conventional delay lock loop circuit 100 shown in FIG. 1. According to an exemplary embodiment of a system, the phase detector 200 is combined with a nonlinear digital filter, in the filter/control circuit 108, to minimize nonlinear behavior of the phase detector 200. The nonlinearity of the filter/control circuit 108 is applied to cancel the nonlinearity of the bang bang phase detector 200, which results in low jitter when in a lock mode.

The phase detector 200 includes a data signal line 201 and a clock signal line 203. The clock signal line 203 is adapted to carry a clock signal. The data signal line 201 is adapted to carry a data signal, or even a clock feedback signal for comparison with a reference clock signal. The phase detector 200 also includes a delay cell 202 having an input coupled to the data signal line 201. The delay cell 202 is adapted to introduce a delay or offset to the clock signal proportional to an offset caused by portions of the rest of the phase detector 200. The phase detector 200 further includes a first double flip-flop 204 having a data input coupled to the data signal line and a clock input coupled to the clock signal line, and a second double flip-flop 206 having a data input coupled to an output of the delay cell 202 and a clock input coupled to the clock signal line 203.

A NOR circuit 208, or equivalent logic circuit, is provided having a first input coupled to an output of the first double flip-flop 204 and a second input coupled to an output of the second double flip-flop 206. The use of double flip-flops reduces the metastability region of the phase detector 200. A lag output signal line is coupled to an output of the NOR circuit 208, and a lead output signal line coupled to the output of the second double flip-flop 206. The delay of the delay cell 202 is preferably larger than the metastability region of each double flip-flop 204 and 206.

According to the preferred embodiment, the first double flip-flop 204 includes a first flip-flop 210 having a data input coupled to the data signal line 201 and a clock input coupled to the clock signal line 203, and a second flip-flop 212 having a data input coupled to an output of the first flip-flop 210 and a clock input coupled to the clock signal line 203. The second double flip-flop 206 includes a third flip-flop 214 having a data input coupled to an output of the delay cell 202 and a clock input coupled to the clock signal line 203, and a fourth flip-flop 216 having a data input coupled to an output of the third flip-flop 214 and a clock input coupled to the clock signal line 203.

The phase detector 200 of FIG. 2 operates in a delay lock loop circuit 100, such as shown in FIG. 1, as follows. When the lag output signal is HIGH, the filter/control circuit 108 in FIG. 1 will downcount. When the lead output signal and the lag output signal are respectively HIGH and LOW, the filter/control circuit 108 will stay the same, the nodes a and b in FIG. 2 will be a=1 and b=0, and the DLL circuit 100 is in the lock condition. The NOR circuit 208 will determine when the phase detector 200 is in the locked condition. In the lock condition, the phase detector output lead output signal and lag output signal will both be 0, and the filter/control will be unchanged, and oscillation is eliminated. The filter/control circuit 108 continuously receives data lead and lag from the lead signal output line 211 and lag signal output line 209, respectively.

While various embodiments of the invention are described above, it should be understood that they are presented for example only, and not as limitations to the following claimns. Accordingly, the scope and breadth of the present invention should only be defined in accordance with the following claims and their equivalents.

What is claimed is:

1. A bang-bang phase detector circuit, comprising:

a data signal line;

a clock signal line;

a delay cell having an input coupled to the data signal line;

a first double flip-flop having a data input coupled to the data signal line and a clock input coupled to the clock signal line;

the first double flip-flop including a first flip-flop having a data input coupled to the data signal line and a clock input coupled to the clock signal line, and a second flip-flop having a data input coupled to an output of the first flip-flop and a clock input coupled to the clock signal line;

a second double flip-flop having a data input coupled to an output of the delay cell and a clock input coupled to the clock signal line;

a NOR circuit having a first input coupled to an output of the second flip-flop of the first double flip-flop and a second input coupled to an output of the second double flip-flop;

a lag output signal line coupled to an output of the NOR circuit; and a lead output signal line coupled to the output of the second double flip-flop.

2. The circuit of claim 1, wherein the second double flip-flop comprises:

a third flip-flop having a data input coupled to an output of the delay cell and a clock input coupled to the clock signal line;

a fourth flip-flop having a data input coupled to an output of the third flip-flop and a clock input coupled to the clock signal line.

3. A bang-bang phase detector circuit, comprising:

a clock signal line;

a data signal line;

a delay cell having an input coupled to the data signal line;

a first sequential logic circuit having a data input coupled to the data signal line and a clock input coupled to the clock signal line;

the first sequential logic circuit including a first sequential logic element having a data input coupled to the data signal line and a clock input coupled to the clock signal line, and a second sequential logic element having a data input coupled to an output of the first sequential logic element and a clock input coupled to the clock signal line;

a second sequential logic circuit having a data input coupled to an output of the delay cell and a dock input coupled to the clock signal line;

a NOR circuit having a first input coupled to an output of the first sequential logic circuit and a second input coupled to an output of the second sequential logic circuit;

a lag signal output coupled to an output of the NOR circuit; and a lead signal output coupled to the output of the second sequential logic circuit.

4. The circuit of claim 3, wherein the second sequential logic circuit comprises:

a third sequential logic element having a data input coupled to an output of the delay cell and a clock input coupled to the clock signal line; and a fourth sequential logic element having a data input coupled to an output of the third sequential logic element and a clock input coupled to the clock signal line.

5. The circuit of claim 4, wherein each sequential logic element is a flip-flop.

6. A bang-bang phase detector circuit, comprising:

a data signal line;

a clock signal line;

a delay cell having an input coupled to the data input;

a first flip-flop having a data input coupled to the data signal line and a clock input coupled to the clock signal line;

a second flip-flop having a data input coupled to an output of the delay cell and a second input coupled to the clock signal line;

a third flip-flop having a data input coupled to an output of the first flip-flop and a second input coupled to the clock signal line;

a fourth flip-flop having a first data coupled to an output of the second flip-flop and a second input coupled to the clock signal line;

a NOR circuit having a first input coupled to an output of the third flip-flop and a second input coupled to an output of the fourth flip-flop;

a lag output signal line coupled to an output of the NOR circuit; and a lead output signal line coupled to the output of the fourth flip-flop.

* * * * *